(12) United States Patent
Walters, Jr.

(10) Patent No.: US 6,584,594 B1
(45) Date of Patent: Jun. 24, 2003

(54) DATA PRE-READING AND ERROR CORRECTION CIRCUIT FOR A MEMORY DEVICE

(75) Inventor: Donald Monroe Walters, Jr., Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/314,574

(22) Filed: May 18, 1999

(51) Int. Cl.[7] ................................................ G11C 29/00

(52) U.S. Cl. .................... 714/763; 714/42; 714/746; 714/768; 711/106; 711/113

(58) Field of Search ................................. 714/763, 764, 714/768, 746, 777, 754, 42, 48; 365/189.05, 222; 711/109, 112, 106, 113; 710/56

(56) References Cited

U.S. PATENT DOCUMENTS

| 6,065,146 A | * | 5/2000 | Bosshart | 714/754 |
| 6,216,201 B1 | * | 4/2001 | Ado et al. | 710/56 |
| 6,438,726 B1 | * | 8/2002 | Walters, Jr. | 714/764 |

* cited by examiner

Primary Examiner—Albert Decady
Assistant Examiner—Guy Lamarre
(74) Attorney, Agent, or Firm—Fliesler Dubb Meyer & Lovejoy, LLP

(57) ABSTRACT

A circuit for correction of errors in a memory device comprises a data word byte counter 16, data encoders 18 and 20, a syndrome accumulator 22, a data word byte address generator 24, a comparator 26, a decoder 28 and an error correction enable buffer 30. The error correction circuit 4 is coupled to a memory array 2 through a pre-read input-output bus 14, and is further coupled to an input-output multiplexer buffer 6 which is coupled between the memory array 2 and a data bus 12.

99 Claims, 5 Drawing Sheets

DATA PRE-READING AND ERROR CORRECTION CIRCUIT FOR A MEMORY DEVICE

TECHNICAL FIELD

The present invention relates to error correction of data in a memory device, and more particularly, to an error correction circuit for a non-volatile memory device.

BACKGROUND ART

In semiconductor integrated memory devices, such as non-volatile memory devices, errors sometimes occur when data are written to or read from the memory devices. Sometimes errors in data storage may occur due to the physical characteristics of the memory devices. For example, in a conventional flash memory device, errors in the data stored in the flash memory may be caused by manufacturing defects or program disturbances. A program disturbance may be caused by an undesirable field turn-on in a typical conventional flash memory array during the programming of the memory gates in the conventional flash memory array. A field turn-on in the substrate region under the select gate transistor field oxide region between two memory gates on adjacent bit lines may cause one of the memory gates which is supposed to be in a program-inhibited state indicating a logic bit "1" to be "turned on" to a programmed state indicating a logic bit "0". Bit errors in the data stored in a conventional non-volatile memory device may also be caused by various other factors.

In order to provide an acceptable level of reliability of data read from a conventional flash memory array, error correcting codes have been integrated into memory storage systems to correct bit errors in the data stored in the memory. Conventional error correcting codes such as block codes have been used in the error correction of data in conventional memory storage systems. For example, Hamming codes, which are within a class of conventional block codes well known to a person skilled in the art, have been used to provide single-bit error correction to preserve the accuracy of data in conventional memory storage devices.

Error checking and correction of data read from a flash memory array cause a delay from the time the data are pre-read from the memory by an error correction circuit to the time the error correction circuit enables the corrected data to be accessed externally by a host system. In order to minimize the time delay, error correction circuits have been implemented to compute the error addresses, that is, the syndrome generated by the error correcting block code, by parallel processing of the data read from the memory device. However, conventional error correction circuits with parallel processing capabilities can be very expensive to implement because of the complexity of the hardware. Parallel processing of data in the computation of the error addresses requires a large number of logic gates. For example, for every 1,000 bits of data read from the conventional flash memory device, approximately 5,000 XOR gates may be required for the parallel processing of data to minimize the delay in computing the syndrome.

Some applications may require that the cost of the memory storage system be minimized rather than the delay from the time of pre-reading the data from the memory array by the error correction circuit to the time the error correction circuit enables the corrected data to be read externally. In order to minimize the hardware cost, conventional error correction circuits and the methods have been implemented which involve serial processing of the data stored in the memory array to generate error addresses based upon a conventional error correcting block code. However, conventional serial processing may require hundreds of clock cycles of delay in the data access time before the data are read by the host system. A long time delay caused by the serial processing of the data may be unacceptable in some applications.

Therefore, there is a need for an error correction circuit and a method of error correction which are capable of reducing the cost of the hardware required for computing the error addresses compared to the hardware costs associated with the conventional parallel processing of the data read from the memory device, while reducing the data access time delay compared to the relatively long time delays resulting from the conventional serial processing of the data to generate the error addresses.

DISCLOSURE OF THE INVENTION

The present invention satisfies these needs. In accordance with the present invention, an error correction circuit for a memory device generally comprises:

(a) a data word byte counter;

(b) first and second data encoders capable of receiving first and second pre-read data bytes, respectively;

(c) a syndrome accumulator, coupled to the data word byte counter and the first and second data encoders, capable of generating a syndrome comprising first and second pluralities of syndrome bits;

(d) a data word byte address generator, coupled to the syndrome generator, capable of generating a plurality of data word byte address bits;

(e) a comparator, coupled to the syndrome accumulator and the data word byte address generator, capable of generating an error correction enable signal in response to comparing the first plurality of the syndrome bits with the data word byte address bits;

(f) a decoder, coupled to the syndrome accumulator, capable of decoding the second plurality of the syndrome bits to generate a plurality of decoded data input bits; and (g) a correction enable buffer, coupled to the comparator and the decoder, capable of generating a plurality of correction bits in response to receiving the decoded data input bits and the error correction enable signal.

In an embodiment, the error correction circuit according to the present invention further comprises a multiplexer, coupled to the second data encoder, to generate a plurality of input bits for the second data encoder. In a further embodiment, the error correction circuit further comprises a syndrome latch, coupled between the syndrome accumulator and the comparator, to store the first and second pluralities of the syndrome bits. The first and second pluralities of the syndrome bits form a byte error address and a bit error address for the data word, respectively. In an embodiment, the byte error address consists of 5 higher order bits of the syndrome byte, and the bit error address consists of 3 lower order bits of the syndrome byte. The byte error address is transmitted to the comparator while the bit error address is transmitted to the decoder.

In a further embodiment, the data word byte counter is capable of generating a plurality of odd bits and a plurality of even bits of a byte count for each of the data words, and is coupled to the syndrome accumulator through first and second channels to transfer the even and odd bits from the data word byte counter to the syndrome accumulator, respectively. The data word byte counter, which counts the bytes within each data word to generate a plurality of byte ordinals for the respective bytes, rearranges the byte ordinals into a plurality of even bytes and a plurality of odd bytes. In a further embodiment, the byte ordinals are represented in a binary format comprising a plurality of counter bits, at least two of the counter bits having a binary 1. In a further embodiment, the data word byte counter is further coupled to the syndrome accumulator through a third channel which is a one-bit line for initializing the syndrome accumulator during the reading operation.

In an embodiment, each page of the memory is divided into 24 data words comprising a first group of 10 data words, a second group of 13 data words subsequent to the first group in sequence, and the last word subsequent to the second group in sequence. The first ten data words each comprise 20 data bytes and the next thirteen data words each comprise 24 data bytes. The last word comprises 16 bytes. The data word byte counter is capable of counting the data bytes of each of the data words to generate a binary count within five bits, at least two of the five bits having a binary 1. For a data word comprising a maximum of 26 data bytes of memory, five bits are sufficient to represent the byte ordinals of the twenty-six data bytes with at least two of the five bits having a binary 1.

When the error correction circuit according to the present invention is applied to the error correction of memory pages wherein each of the data bytes comprises 8 bits of data, a syndrome byte may comprise 5 byte error address bits and 3 bit error address bits, with the byte address bits being the higher order bits and the bit address bits being the lower order bits of the syndrome byte.

In an embodiment, the first and second data encoders comprise first and second block encoders, respectively, each of the block encoders capable of generating a set of coded bits and a parity bit associated with the coded bits. In a further embodiment, the first and second data encoders comprise first and second Hamming encoders, respectively, using a Hamming code. The coded bits and the parity bit generated by each Hamming encoder are transmitted to the syndrome accumulator for convolutional operations to generate the syndrome.

Furthermore, the data word byte address generator is capable of generating a data word byte address for each byte that is to be written to the memory. The data word byte address is transferred to the syndrome accumulator to generate the error address. In the page write operation, the data word byte address generator is further coupled to the syndrome accumulator through a second channel to signify to the syndrome accumulator such that a write operation is initiated when the write data word byte address is generated.

The present invention also provides a memory device which includes the error correction circuit as described above. The memory device according to the present invention roughly comprises a memory array, an error correction circuit coupled to the memory array, and an input-output multiplexer buffer coupled to the memory array and to receive the correction enable bits from the correction enable buffer in the error correction circuit. In an embodiment, the memory device according to the present invention further comprises a pre-read input-output bus coupled between the error correction circuit and the memory array. In a further embodiment, data input and output buffers are coupled to the input-output multiplexer buffer to transfer data from a data bus to the memory array and from the memory array to the data bus, respectively.

Advantageously, the error correct circuit according to the present invention reduces the delay from the time a data page is pre-read by the error correction circuit to the time the corrected data are allowed to be read externally from the data bus. Instead of requiring hundreds of cycles of delay in the data access time resulting from the conventional serial processing of the data in a conventional error correction circuit, the error correction circuit according to the present invention is able to reduce the delay in the external data access time to only about ten internal clock cycles for a memory page having a size of 512 data bytes. A further advantage Of the present invention is that it is able to reduce the cost of the memory hardware by reducing the number of logic gates required for the conventional parallel processing of the data for error correction. Therefore, the memory device and the associated error correction circuit according to the present invention are able to correct data errors more efficiently than conventional serial processing while providing a simpler and less expensive hardware structure than that required for conventional parallel processing.

BRIEF DESCRIPTION OF THE DRAWINGS

The present invention will be described with respect to particular embodiments thereof, and references will be made to the drawings in which.

MODES FOR CARRYING OUT THE INVENTION

Figure 1:
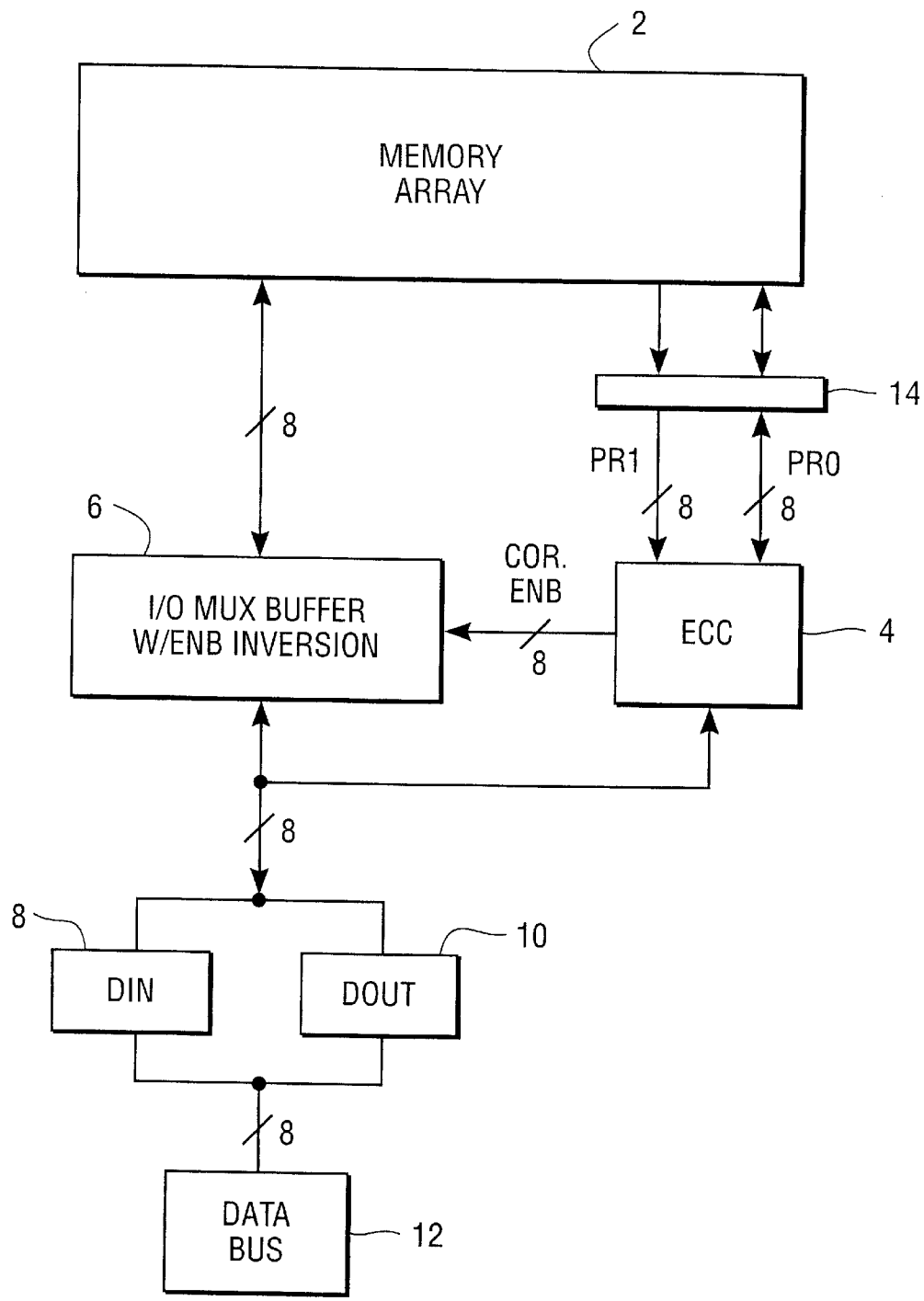
FIG. 1 shows a simplified block diagram of a memory device with a memory array and an error correction circuit according to the present invention.

FIG. 1 shows a simplified block diagram of a memory device comprising a memory array 2 and an error correction circuit 4 in accordance with the present invention. The memory device further comprises an input-output multiplexer buffer 6 which is coupled to both the memory array 2 and the error correction circuit 4. Furthermore, a data input buffer 8 and a data output buffer 10 are coupled to the input-output multiplexer buffer 6 to transfer data which are to be written to and read from the memory array 2 through the input-output multiplexer 6, respectively. The data input and output buffers 8 and 10 are coupled to a data bus 12 which interfaces the memory array 2 with components external to the memory device.

In an embodiment, the memory device according to the present invention further comprises a data pre-read input-output bus 14, coupled between the error correction circuit 4 and the memory array 2, to transfer the data bytes between the memory array 2 and the error correction circuit 4 during both reading and writing operations. In an embodiment, the input-output multiplexer buffer 6 is capable of inverting the correction bits received from the error correction circuit 4 upon detecting an error in a data word which is pre-read from the memory array 2 by the error correction circuit 4.

Figure 2:
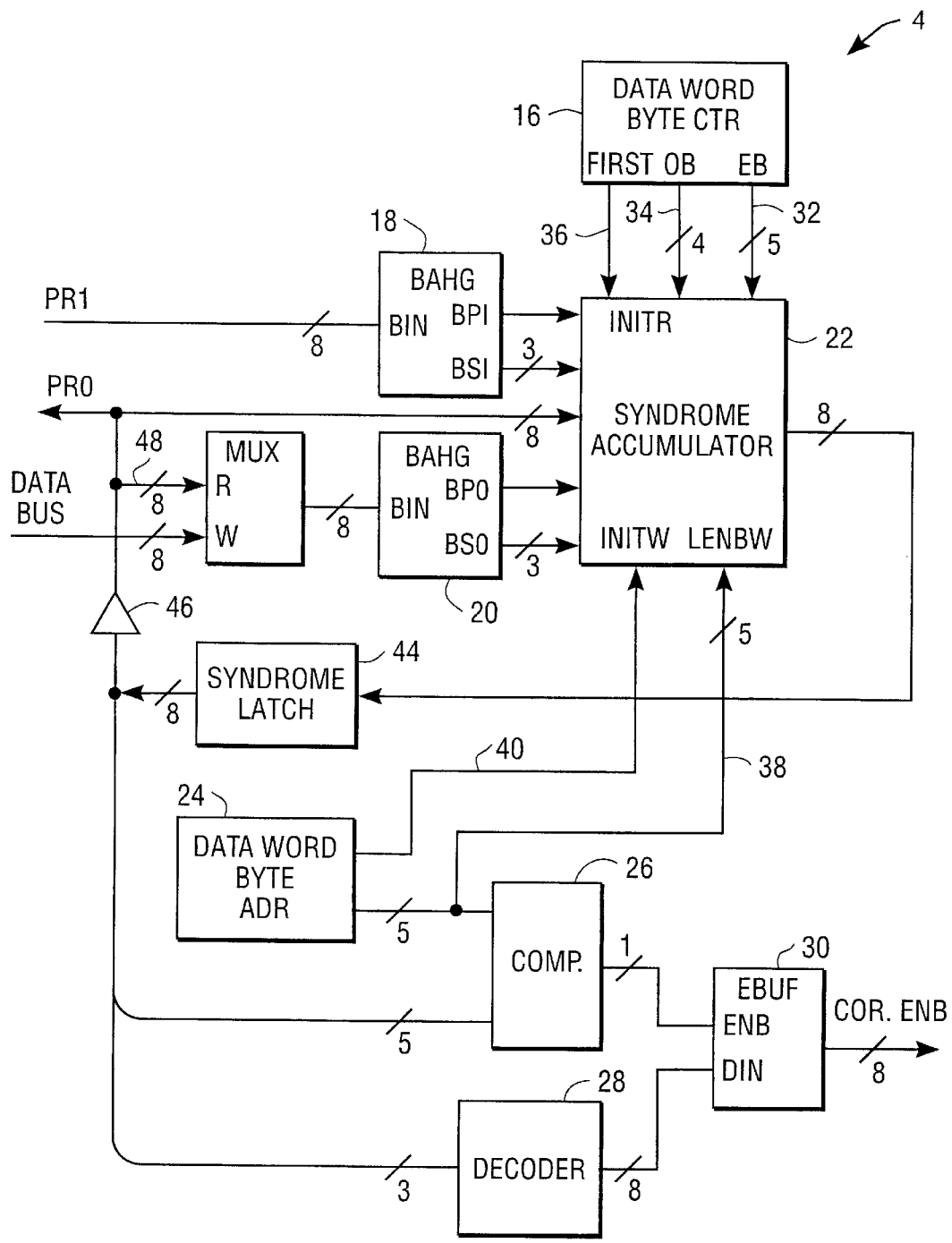
FIG. 2 shows a block diagram of an embodiment of the error correction circuit according to the present invention.

FIG. 2 shows a block diagram of an embodiment of the error correction circuit 4 in accordance with the present invention. While the block diagram of FIG. 2 shows an embodiment with 8-bit error correction, the principles of the present invention are also applicable to 16-bit error correction. For example, the structure of FIG. 2 may be replicated for error correction of 16 bits of data at a time. The error correction circuit 4 comprises a data word byte counter 16, a first data encoder 18, a second data encoder 20, a syndrome accumulator 22, a data word byte address generator 24, a byte address comparator 26, a decoder 28, and an error correction enable buffer 30. The first and second data encoders 18 and 20 are capable of receiving first and second pre-read memory data, designated as PR1 and PR0, respectively. The first and second data encoders 18 and 20 generate first and second pluralities of coded bits denoted as BS1 and BS0, respectively, and first and second parity bits denoted as BP1 and BP0 for the convolutional operation in the syndrome accumulator.

Figure 3:
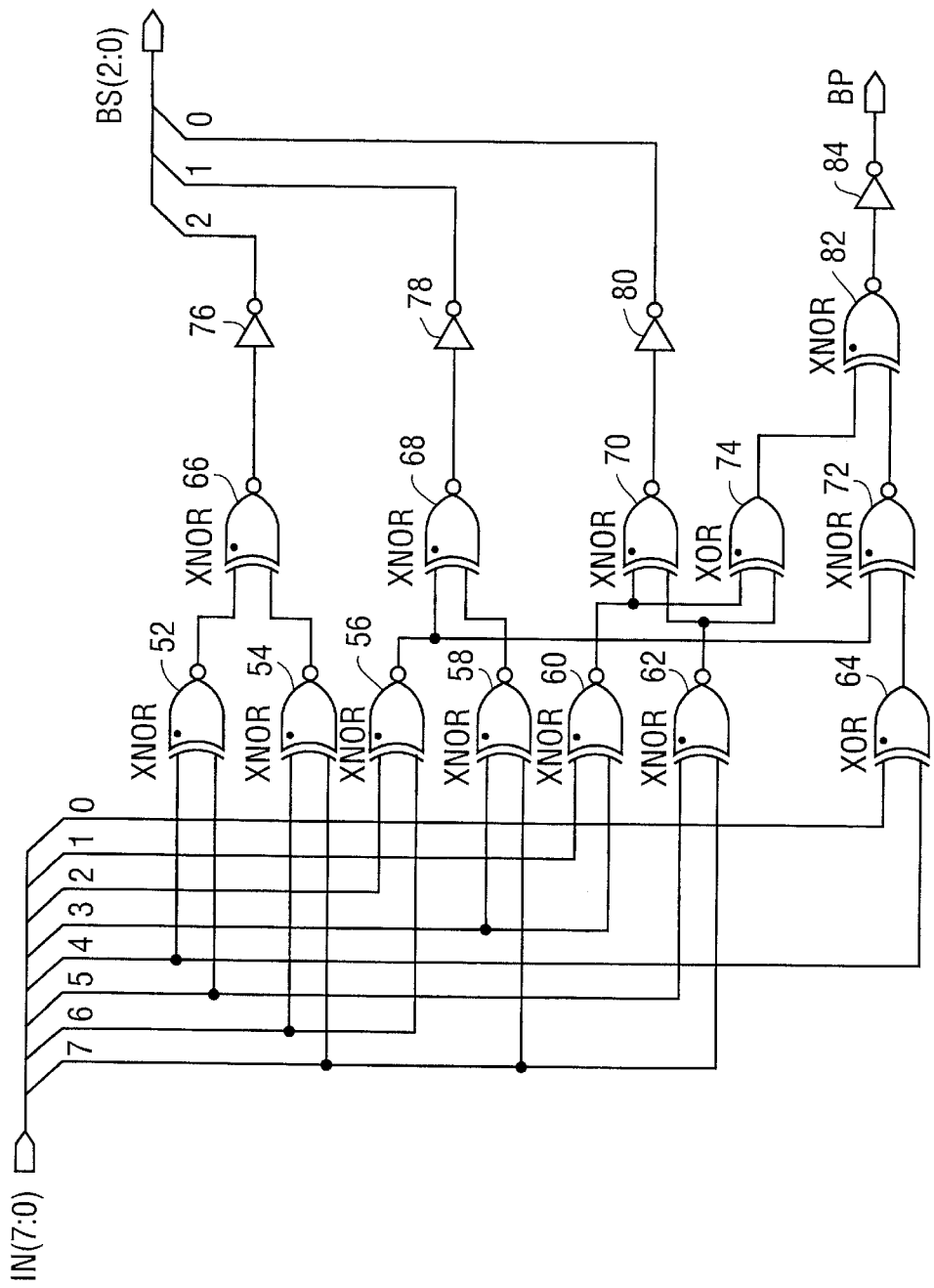
FIG. 3 shows a logic circuit diagram of a data encoder with a plurality of XNOR and XOR gates in the error correction circuit according to the present invention.

In an embodiment, the first and second data encoders 18 and 20 comprise first and second block encoders, respectively, which encode the first and second pre-read memory data bytes by using a conventional block code. In a further embodiment, the block code used to encode the pre-read memory data bytes in the encoders 18 and 20 is a conventional Hamming code, which is well known to a person skilled in the art. An example of a bit address Hamming encoder for coding an 8-bit byte into three coded bits and an associated parity bit is shown in FIG. 3 and will be described in detail below.

Referring to FIG. 2, the data word byte counter 16, which is coupled to the syndrome accumulator 22, is capable of generating a plurality of odd byte ordinals and a plurality of even byte ordinals of a byte count. In an embodiment, the odd and even bytes of the byte count are generated by renumbering and rearranging the byte ordinals of the individual bytes within a given data word which is pre-read from the memory array. In a further embodiment, the renumbered and rearranged byte count comprises the plurality of counter bits, for example, five counter bits, which represent the renumbered and rearranged byte ordinals in a binary format. In yet a further embodiment, the 5-bit binary representation of the byte ordinals are coded such that at least two of the counter bits have a binary number "1". An example of a listing of counter bits with a 5-bit binary representation of renumbered and rearranged byte ordinals of a 24-byte data word is shown in Table A below:

TABLE A

| Decimal Byte Ordinals | 5-Bit Binary Representation | | | | |
|---|---|---|---|---|---|
| 3 | 0 | 0 | 0 | 1 | 1 |
| 5 | 0 | 0 | 1 | 0 | 1 |
| 6 | 0 | 0 | 1 | 1 | 0 |
| 7 | 0 | 0 | 1 | 1 | 1 |
| 10 | 0 | 1 | 0 | 1 | 0 |
| 11 | 0 | 1 | 0 | 1 | 1 |
| 12 | 0 | 1 | 1 | 0 | 0 |
| 13 | 0 | 1 | 1 | 0 | 1 |
| 14 | 0 | 1 | 1 | 1 | 0 |
| 15 | 0 | 1 | 1 | 1 | 1 |
| 18 | 1 | 0 | 0 | 1 | 0 |
| 19 | 1 | 0 | 0 | 1 | 1 |
| 20 | 1 | 0 | 1 | 0 | 0 |
| 21 | 1 | 0 | 1 | 0 | 1 |
| 22 | 1 | 0 | 1 | 1 | 0 |
| 23 | 1 | 0 | 1 | 1 | 1 |
| 24 | 1 | 1 | 0 | 0 | 0 |

TABLE A-continued

| Decimal Byte Ordinals | 5-Bit Binary Representation | | | | |
|---|---|---|---|---|---|
| 25 | 1 | 1 | 0 | 0 | 1 |
| 26 | 1 | 1 | 0 | 1 | 0 |
| 27 | 1 | 1 | 0 | 1 | 1 |
| 28 | 1 | 1 | 1 | 0 | 0 |
| 29 | 1 | 1 | 1 | 0 | 1 |
| 30 | 1 | 1 | 1 | 1 | 0 |
| 31 | 1 | 1 | 1 | 1 | 1 |

It is evident that this listing omits the decimal byte ordinals 0, 1, 2, 4, 8 and 16, each of which has less than 2 counter bits with a binary number "1" when the decimal byte ordinals converted into a binary format. Therefore, the maximum number of data bytes in a data word that can be represented by the byte ordinals in a format of 5 counter bits, with at least two of the counter bits having a binary "1", is 26 bytes. Furthermore, decimal byte ordinals 9 and 17 are omitted since a maximum of only 24 bytes are included in a data word in the embodiment described above. The byte ordinals 0, 1, 2, 4, 8 and 16 are skipped, and the decimal byte ordinals as listed in Table A are assigned to the twenty-six bytes of data in the data word. A listing of the decimal byte ordinals assigned to bytes 1–24 of a 24-byte data word, byte 1 being the first byte and byte 24 being the last byte in the data word, is shown in Table B below:

TABLE B

| Order of Byte in Data Word | Decimal Byte Ordinals |
|---|---|
| 1 | 3 |
| 2 | 5 |
| 3 | 6 |
| 4 | 7 |
| 5 | 10 |
| 6 | 11 |
| 7 | 12 |
| 8 | 13 |
| 9 | 14 |
| 10 | 15 |
| 11 | 18 |
| 12 | 19 |
| 13 | 20 |
| 14 | 21 |
| 15 | 22 |
| 16 | 23 |
| 17 | 24 |
| 18 | 25 |
| 19 | 26 |
| 20 | 27 |
| 21 | 28 |
| 22 | 29 |
| 23 | 30 |
| 24 | 31 |

The renumbering of the byte ordinals for the bytes in a data word is applicable to error corrections in both reading and writing operations. In a pre-reading operating, the data word byte counter 16 assigns the renumbered decimal byte ordinals as listed in Table B above to two groups, one group of even bytes and another group of odd bytes, as listed in Table C below:

TABLE C

Data Word Byte Numbering

Pre-reading Channels:

| Even | Odd |
|---|---|
| 3 | 5 |
| 6 | 7 |
| 10 | 11 |
| 12 | 13 |
| 14 | 15 |
| 18 | 19 |
| 20 | 21 |
| 22 | 23 |
| 24 | 25 |
| 26 | 27 |
| 28 | 29 |
| 30 | 31 |

In a further embodiment, the data word byte counter 16 is coupled to the syndrome accumulator 22 through a first channel 32 which is capable of transmitting five even bits, denoted as EB in FIG. 2, from the data word byte counter 16 to the syndrome accumulator 22. Furthermore, a second channel 34 is coupled between the data word byte counter 16 and the syndrome accumulator 22 to the transfer the odd bytes, denoted as OB in FIG. 2, from the data word byte counter to the syndrome accumulator 22. Although both even and odd bytes of the renumbered byte ordinals are presented in a 5-bit binary format as shown in Table A above, the second channel 34 for the transmission of the odd bytes may have only four bits whereas the first channel 32 for the transmission of the even bits requires five bits. Referring to Table C above, all of the byte ordinals for the odd bytes have the least significant bit "1" when represented in a binary format. Therefore, the second channel 34 requires only four bits to transmit the byte ordinals of the odd bytes from the data word byte counter 16 to the syndrome accumulator 22.

Furthermore, in order to perform more efficient pre-reading operations by the error correction circuit according to the present invention, two data words may be coded simultaneously by the data encoders 18 and 20, and the bytes of the two data words may be counted by the data word byte counter 16. Each data page stored in the memory array 2, the memory array 2 being shown in FIG. 1, may be arranged such that it comprises 24 data words arranged in three groups. The first group comprises 10 data words each having 20 data bytes, and the second group comprises 13 data words each having 24 data bytes. The last group contains a single word having 16 bytes.

In the embodiment shown in FIG. 2, the error correction circuit according to the present invention further comprises a third channel 36 coupled between the data word byte counter 16 and the syndrome accumulator 22. The third channel 36 is a one-bit data line which allows the data word byte counter 16 to initiate syndrome accumulation by the syndrome accumulator 22 in data reading mode.

The error correction circuit according to the present invention is not limited to performing the pre-reading operations on memory pages with a data word format as described above; other arrangements of the data words within a data page may also be used. In a further embodiment, the error correction circuit according to the present invention is further capable of data transfer during a page writing operation to the memory array. In this embodiment, the data word byte address generator 24 is capable of generating renumbered and rearranged byte ordinals for each of the bytes within a data word as listed in Table B above for the syndrome accumulator 22. The byte ordinals for a data word which is to be written to the memory array are represented in a 5-bit binary format and transmitted from the data word byte address generator 24 to the syndrome accumulator 22 through a 5-bit channel 38. Furthermore, the data word byte address generator 24 is further coupled to the syndrome accumulator 22 through a one-bit channel to initiate syndrome accumulation by the syndrome accumulator in data writing mode.

In a further embodiment, the error correction circuit according to the present invention further comprises a multiplexer 42 which is coupled between the second data encoder 20 and the data bus to generate a plurality of input bits for the second data encoder 20. Depending upon whether the memory array is in the read mode or the write mode, the multiplexer 42 generates either read or write data bytes for the data encoder 20 to generate the coded data bits BS0 and the associated parity bit BP0. Furthermore, the error correction circuit according to the present invention may further comprise a syndrome latch 44, coupled between the syndrome accumulator 22 and the comparator 26, to temporarily store the first and second pluralities of the syndrome bits generated by the syndrome accumulator 22.

In an embodiment in which the syndrome output from the syndrome accumulator 22 is an 8-bit byte, the syndrome latch 44 transmits the five higher order bits of the syndrome byte to the comparator 26 and the three lower order bits of the syndrome byte to the decoder 28. Furthermore, a buffer 46 is coupled between the syndrome latch 44 and the read input 48 of the multiplexer 42 to transmit the eight syndrome bits from the syndrome latch 44 to the read input R of the multiplexer 42. The buffer 46 transfers the bits from the syndrome latch 44 to the PR0 line in data writing mode.

The data word byte generator 24 generates a data word byte address for each of the bytes within each data word for both reading and writing operations. During the write operation, the data word byte address generator 24 signifies to the syndrome accumulator 22 to initiate the write operation and transfers the renumbered byte ordinals as the data word byte addresses in the 5-bit format to the syndrome accumulator 22 as described above. In the data reading mode in which data is read from the memory array, the data word byte address generator 24 transmits the data is word byte address bits to the comparator 26, which is also coupled to receive the byte error address, that is, the five higher order bits of the syndrome byte from the syndrome latch 44. The comparator 26 compares the data word byte address from the data word byte address generator 24 with the byte error address from the syndrome latch 44 to determine whether the data word byte address matches the byte error address. If the data word byte address matches the byte error address, the comparator 26 generates an error correction enable signal, which is a one-bit signal, and transmits it to the correction enable buffer 30 to detect the error in the read data.

The bit error address, which comprises the three lower order bits of the syndrome byte, is transmitted to the decoder 28 which decodes the bit error address into an 8-bit format. The decoded bit error address is transferred from the decoder 28 to the data input $D_{IN}$ of the correction enable buffer 30. If the output of the comparator 26 is "1", which indicates that there is no error in the input data, the correction enable buffer 30 outputs a plurality of correction enable bits which are all "0". On the other hand, if the output generated by the comparator 26 is "0", which signifies that an error exists in the input data bits, the correction enable buffer 30 generates the correction enable bits identical to the decoded bits from the decoder 28.

FIG. 3 shows a logic circuit diagram of a Hamming code generator which can be used as the first or second block encoder 18 or 20 as shown in FIG. 2. The Hamming code generator as shown in FIG. 3 is capable of receiving an 8-bit byte input IN(7:0) and in response generates a coded 3-bit output BS(2:0) and a parity bit BP associated with the coded output bits BS(2:0). In the embodiment shown in FIG. 3, a plurality of XNOR gates 52, 54, 56, 58, 60, 62 and an XOR gate 64 are coupled to the input bits IN(7:0) in a first stage of logic gates. The XNOR gate 52 has inputs coupled to bits 4 and 5 of the input bits IN(7:0), and the XNOR gate 54 has inputs coupled to bits 6 and 7 of the input bits IN(7:0). The inputs of the XNOR gate 56 are coupled to bits 2 and 6, and the inputs of the XNOR gate 58 are coupled to bits 3 and 7 of the input bits IN(7:0). The inputs of the XNOR gate 60 are coupled to bits 1 and 3, and the inputs of the XNOR gate 62 are coupled to bits 5 and 7 of the input bits IN(7:0). The XOR gate 64 has inputs coupled to bits 0 and 4 of the input bits IN(7:0).

The Hamming code generator as shown in FIG. 3 further comprises a plurality of second-stage logic gates including a plurality of XNOR gates 66, 68, 70, 72 and an XOR gate 74. The XNOR gate 66 has inputs connected to the outputs of the XNOR gates 52 and 54 while the XNOR gate 68 has inputs connected to the outputs of the XNOR gates 56 and 58. The inputs of the XNOR gate 70 are connected to the outputs of the XNOR gates 60 and 62, while the inputs of the XNOR gate 72 are connected to the outputs of the XNOR gate 56 and the XOR gate 64. The second-stage XOR gate 74 has inputs connected to the outputs of the XNOR gates 60 and 62.

The outputs of the XNOR gates 66, 68 and 70 are coupled to inverters 76, 78 and 70, respectively, which generate the coded output bits BS(2:0). The outputs of the XNOR gate 72 and the XOR gate 74 are connected to a third-stage XNOR gate 82, which generates an output inverted by an inverter 84 to produce the parity bit BP. The parity bit BP and the coded output bits BS(2:0) are transmitted to the syndrome accumulator for convolutional operations to generate the syndrome.

The Hamming code generators for encoding an 8-bit input byte into a coded 3-bit output and generating an associated parity bit as shown in FIG. 3 and described above is only one of many possible embodiments for the data encoders 18 and 20 in the error correction circuit according to the present invention as shown in FIG. 2. Other error correction coding techniques can also be used which are within the scope of the present invention. Moreover, the inputs to the data encoders 18 and 20 as shown in FIG. 2 are not limited to 8-bit byte inputs. The data encoders 18 and 20 can be designed to accommodate pre-read input bits other than 8 bits.

Figure 4:
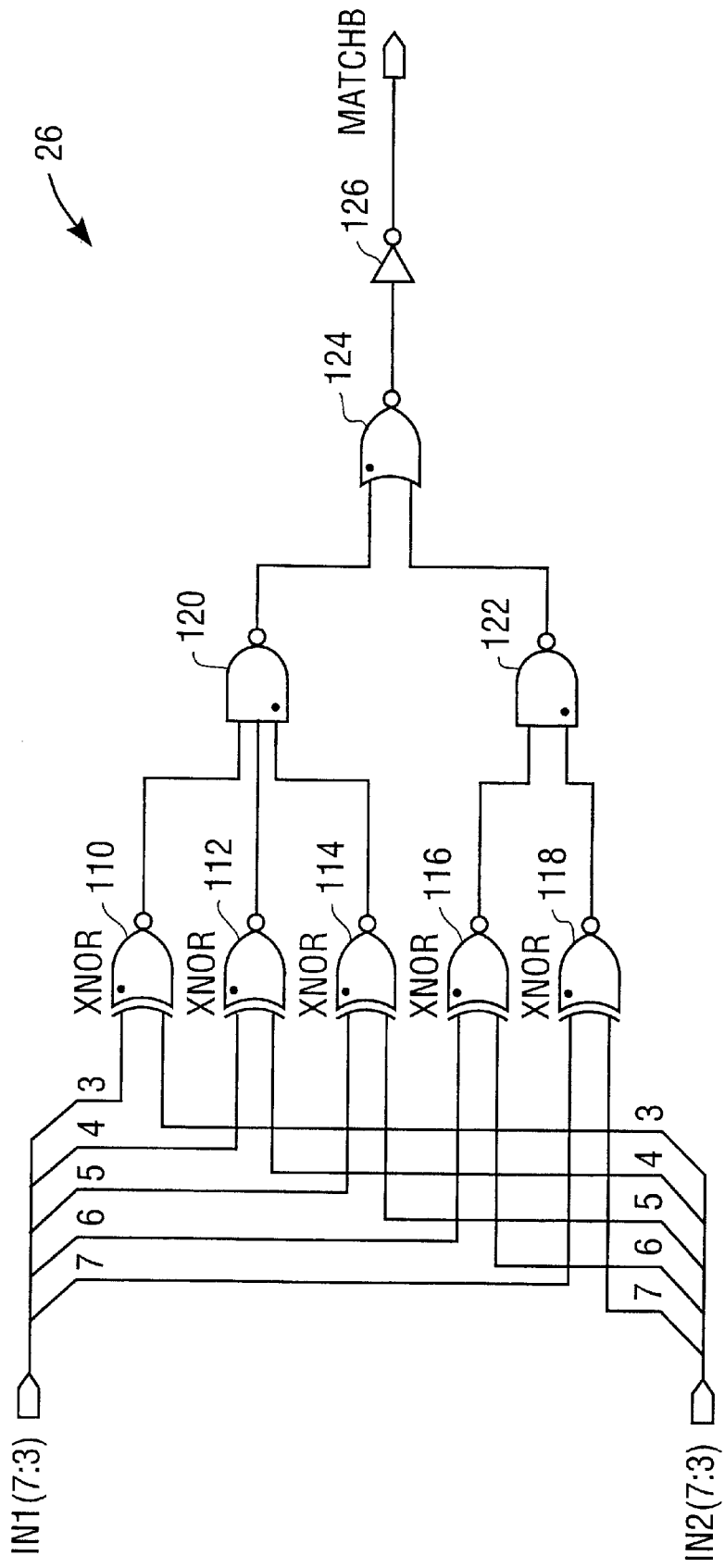
FIG. 4 shows a logic circuit diagram of an embodiment of a byte address comparator in the error correction circuit according to the present invention.

FIG. 4 shows a logic circuit diagram of an embodiment of a byte address comparator 26 in the error correction circuit according to the present invention. The byte address comparator 26 has two 5-bit inputs IN1(7:3) and IN2(7:3), and outputs an output bit MATCHB depending upon whether the first input IN1(7:3) exactly matches the second input IN2(7:3). The byte address comparator as shown in FIG. 4 outputs a bit "0" if each of the bits in the input IN1(7:3) matches the corresponding bit in the input IN2(7:3), or an output bit "1" if there is a mismatch between any of the corresponding bits in the two inputs. One of the 5-bit inputs, such as IN1(7:3), may be connected to receive the data word byte address from the data word byte address generator 24 while the other input, such as IN2(7:3), may be connected to the syndrome latch 44 in FIG. 2 to receive the five high order bits of the syndrome bits.

Referring back to FIG. 4, the byte address comparator 26 comprises a plurality of XNOR gates 110, 112, 114, 116 and 118, NAND gates 120 and 122, a NOR gate 124 and an inverter 126. The XNOR gates 110, 112, 114, 116 and 118 each have two inputs coupled to receive a respective pair of input bits from the first and second inputs IN1(7:3) and IN2(7:3). The NAND gate 120 has three inputs connected to the outputs of the XNOR gates 110, 112 and 114 while the NAND gate 122 has two inputs connected to the outputs of the XNOR gates 116 and 118. The outputs of the NAND gates 120 and 122 are connected to the inputs of the NOR gate 124, the output of which is connected to an inverter 126. The output of the inverter 126 generates the output error signal MATCHB, which is either bit "0" if the two inputs IN1(7:3) and IN2(7:3) exactly match each other or bit "1" if there is any mismatch between the corresponding bits in the inputs IN1(7:3) and IN2(7:3). The byte address comparator 26 in the error correction circuit according to the present invention as shown in FIG. 2 is not limited to the logic circuit as shown in FIG. 4; other logic circuits can also be implemented to perform a comparison between the data word byte address and the byte error address.

Figure 5:
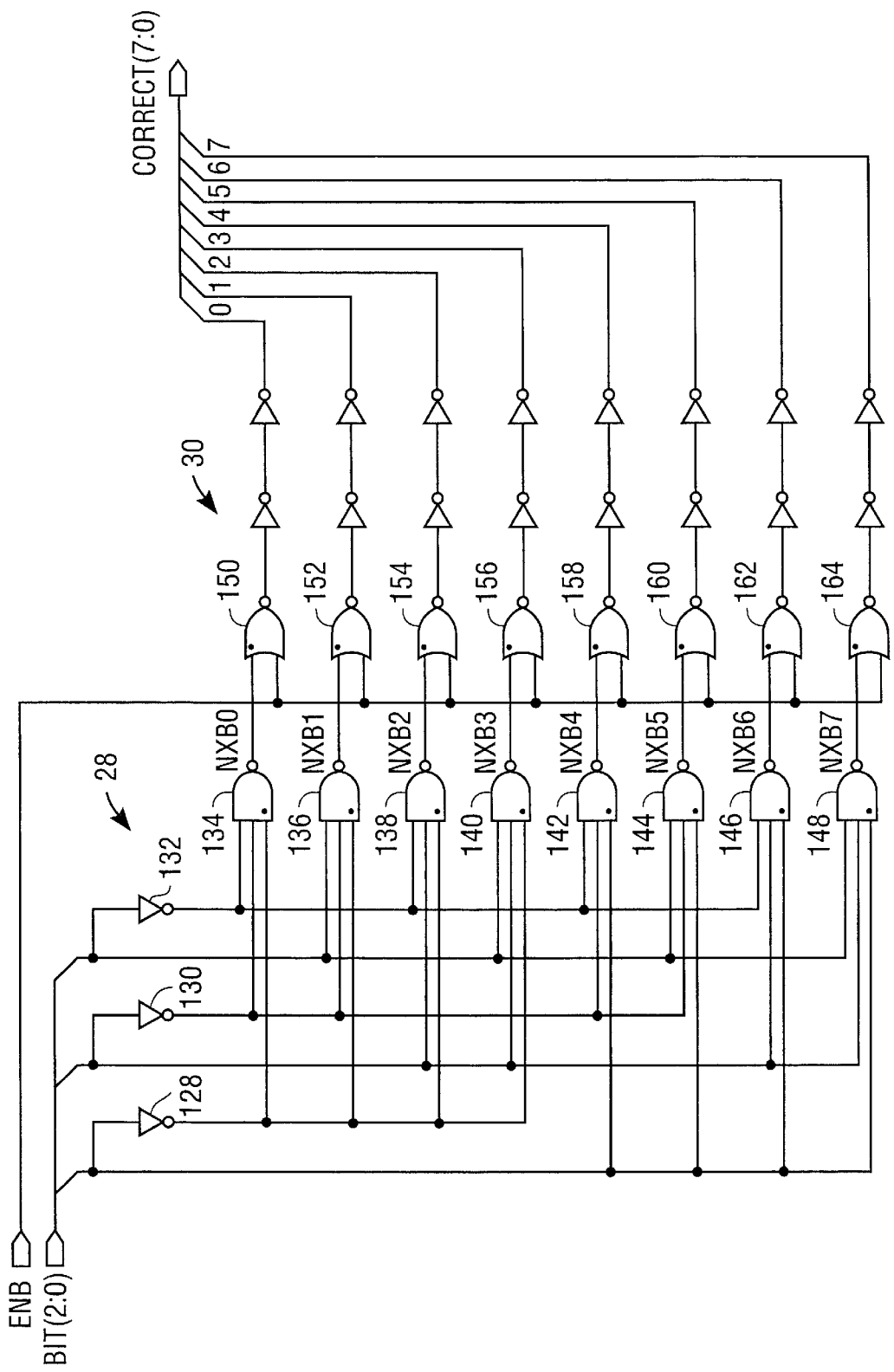
FIG. 5 shows a logic circuit diagram of an embodiment of a decoder combined with an error correction enable buffer in the error correction circuit according to the present invention.

FIG. 5 is a logic diagram of an embodiment of a circuit which combines both the functions of the decoder 28 and of the error correction enable buffer 30 as shown in the block diagram of FIG. 2. Referring to FIG. 5, the decoder 28 has a 3-bit input BIT(2:0) and eight parallel outputs denoted as NXB0, NXB1, NXB2, . . . NXB7 for outputting the eight bits decoded from the three input bits BIT(2:0). The decoder 28 includes three inverters 128, 130 and 132 coupled to bits 2, 1. and 0 of the input BIT(2:0), respectively. The decoder 28 further comprises eight NAND gates 134, 136, 138, 140, 142, 144, 146 and 148 each having three inputs coupled to receive a different combination of non-inverted and inverted bits of the input bits BIT(2:0). The outputs NXB0, NXB1, NXB2, . . . NXB7 of the respective NAND gates 134, 136, 138, . . . 148 generate the decoded 8-bit output in response to receiving the coded input bits BIT (2:0).

The error correction enable buffer 30, which is coupled to receive the decoded bits from the decoder 28 and to receive the error correction enable signal ENB, which is the 1-bit output from the byte address comparator. The error correction enable buffer 30 comprises a plurality of NOR gates 150, 152, 154, 156, 158, 160, 162 and 164 each having two inputs, the first inputs connected to receive the error correction enable signal ENB and the second inputs connected to the outputs of the respective NAND gates 134, 136, 138, 140, 142, 144, 146 and 148 in the decoder 28. Each of the NOR gates 150, 152, 154, . . . 164 is connected to a cascade of two inverters which provide a time delay for the output of the respective NOR gate. The 8-bit output correction byte CORRECT(7:0) includes bits 0, 1, 2, . . . 7, which are the same as bits generated by the outputs of the respective NOR gates 150, 152, 154, . . . 164. The error correction circuit output COR.ENB as shown in FIG. 1 transmits the error correction byte CORRECT(7:0) from the error correction circuit 4 to the input-output multiplexer buffer 6.

The memory device and the error correction circuit as shown in FIGS. 1 and 2 according to the present invention are capable of performing error correction to achieve fast transfer of data between the data bus and the memory array by reducing the time needed for error correction. The detailed embodiments described above are only some illustrative examples of the error correction circuit according to the present invention. It will be appreciated that other data encoding and address formatting schemes can be also used within the scope of the present invention.

INDUSTRIAL APPLICABILITY

The present invention is applicable to the error correction of data in a memory device, and more particularly, to the error correction of data in a flash memory device. The present invention is also applicable to the error correction of data in other memory devices, such as random access memory devices, magnetic storage devices and optical storage devices. All of the components of the error correction circuit according to the present invention may be integrated with the memory array on a single semiconductor integrated circuit chip. Alternatively, some or all of the components of the error correction circuit according to the present invention may be implemented on one or more integrated circuits external to the memory array. Various physical implementations of the error correction apparatus and method can be realized which are within the scope of the present invention.

The invention has been described with respect to particular embodiments thereof, and numerous modifications can be made which are within the scope of the invention as set forth in the claims.

What is claimed is:

1. An error correction circuit for a memory device, comprising:
   (a) a data word byte counter;
   (b) first and second data encoders capable of receiving first and second pre-read data bytes, respectively;
   (c) a syndrome accumulator, coupled to the data word byte counter and the first and second data encoders, capable of generating a syndrome comprising first and second pluralities of syndrome bits;
   (d) a data word byte address generator, coupled to the syndrome generator, capable of generating a plurality of data word byte address bits;
   (e) a comparator, coupled to the syndrome accumulator and the data word byte address generator, capable of generating an error correction enable signal in response to comparing the first plurality of the syndrome bits with the data word byte address bits;
   (f) a decoder, coupled to the syndrome accumulator, capable of decoding the second plurality of the syndrome bits to generate a plurality of decoded data input bits; and
   (g) a correction enable buffer, coupled to the comparator and the decoder, capable of generating a plurality of correction bits in response to receiving the decoded data input bits and the error correction enable signal.

2. The circuit of claim 1, further comprising a multiplexer having an output coupled to the second data encoder, a first input coupled to a data bus to receive the second pre-read data byte and a second input coupled to receive the first and second pluralities of syndrome bits from the syndrome accumulator.

3. The circuit of claim 2, further comprising a syndrome latch, coupled between the syndrome accumulator and the comparator, to store the first and second pluralities of the syndrome bits.

4. The circuit of claim 3, wherein the syndrome latch is further coupled between the syndrome accumulator and the decoder.

5. The circuit of claim 3, further comprising a buffer, coupled between the syndrome latch and the multiplexer, to transfer the first and second pluralities of the syndrome bits to the multiplexer.

6. The circuit of claim 1, wherein the syndrome accumulator is further coupled to receive the second pre-read data byte.

7. The circuit of claim 1, wherein the data word byte counter is capable of generating a plurality of odd bits and a plurality of even bits of a byte count, further comprising:
   (h) a first channel coupled between the data word byte counter and the syndrome accumulator to transfer the even bits from the data word byte counter to the syndrome accumulator; and
   (i) a second channel coupled between the data word byte counter and the syndrome accumulator to transfer the odd bits from the data word byte counter to the syndrome accumulator.

8. The circuit of claim 7, wherein the first channel is capable of transferring five bits and the second channel is capable of transferring four bits.

9. The circuit of claim 7, wherein the data word byte counter is capable of counting the data bytes of each of the data words to generate a binary count within a plurality of counter bits, at least two of the counter bits having a binary 1.

10. The circuit of claim 7 for error correction of a page of memory comprising a plurality of words, the circuit further comprising a third channel coupled between the data word byte counter and the syndrome accumulator to initiate syndrome accumulation by the syndrome accumulator during data reading operation.

11. The circuit of claim 10, wherein the page of memory comprises a first group of 10 words, each word within the first group comprising 20 bytes.

12. The circuit of claim 11, wherein the page of memory further comprises a second group of words subsequent to the first group of words in sequence, each word within the second group comprising 24 bytes.

13. The circuit of claim 12, wherein the page of memory further comprises a final word subsequent to the second group of words in sequence, the final word comprising 16 bytes.

14. The circuit of claim 13, wherein the data word byte counter is capable of counting the data bytes of each of the data words to generate a binary count within five bits, at least two of the five bits having a binary 1.

15. The circuit of claim 1, wherein the first and second pre-read data bytes each comprise 8 bits.

16. The circuit of claim 15, wherein the first plurality of syndrome bits comprise a plurality of byte error address bits and the second plurality of syndrome bits comprise a plurality of bit error address bits, the byte error address bits being higher order bits and the bit error address bits being lower order bits of the syndrome.

17. The circuit of claim 16, wherein the byte error address bits comprise five bits and the bit error address bits comprise 3 bits.

18. The circuit of claim 17, wherein the data word byte address bits generated by the data word byte address generator comprise five bits.

19. The circuit of claim 1, wherein the first data encoder comprises a first block encoder capable of generating a first plurality of coded bits and a first parity bit associated with the first plurality of coded bits, and the second data encoder comprises a second block encoder capable of generating a second plurality of coded bits and a second parity bit associated with the second plurality of coded bits.

20. The circuit of claim 19, wherein the first and second block encoders comprise first and second Hamming encoders, respectively.

21. The circuit of claim 19, wherein the first and second pluralities of the coded bits each comprise 3 bits.

22. The circuit of claim 1, further comprising a first channel coupled between the data word byte address generator and the syndrome accumulator to transfer the data word byte address bits to the syndrome accumulator, the data word byte address bits comprising a plurality of write byte address bits during data writing operation.

23. The circuit of claim 22, further comprising a second channel coupled between the data word byte address generator and the syndrome accumulator to initiate syndrome accumulation by the syndrome accumulator during data writing operation.

24. The circuit of claim 22, wherein the write byte address bits comprise five bits.

25. A memory device, comprising:
(a) a memory array;
(b) an error correction circuit, coupled to the memory array, comprising:
(i) a data word byte counter;
(ii) first and second data encoders capable of receiving first and second pre-read data bytes, respectively;
(iii) a syndrome accumulator, coupled to the data word byte counter and the first and second data encoders, capable of generating a syndrome comprising first and second pluralities of syndrome bits;
(iv) a data word byte address generator, coupled to the syndrome generator, capable of generating a plurality of data word byte address bits;
(v) a comparator, coupled to the syndrome accumulator and the data word byte address generator, capable of generating an error correction enable signal in response to comparing the first plurality of the syndrome bits with the data word byte address bits;
(vi) a decoder, coupled to the syndrome accumulator, capable of decoding the second plurality of the syndrome bits to generate a plurality of decoded data input bits; and
(vii) a correction enable buffer, coupled to the comparator and the decoder, capable of generating a plurality of correction bits in response to receiving the decoded data input bits and the error correction enable signal; and
(c) an input-output multiplexer buffer coupled to the memory array and to the correction enable buffer.

26. The device of claim 25, wherein the input-output multiplexer buffer is capable of inverting the correction bits received from the correction enable buffer.

27. The device of claim 25, further comprising a pre-read input-output bus coupled between the error correction circuit and the memory array.

28. The device of claim 25, further comprising a data input buffer coupled to the input-output multiplexer buffer.

29. The device of claim 28, further comprising a data output buffer coupled to the input-output multiplexer buffer.

30. The device of claim 29, further comprising a data bus coupled to the data input and output buffers.

31. The device of claim 25, wherein the error correction circuit further comprises a multiplexer coupled to the second data encoder.

32. The device of claim 31, wherein the multiplexer is further coupled to receive the second pre-read data byte as a write byte from the data input buffer.

33. The device of claim 31, wherein the error correction circuit further comprises a syndrome latch, coupled between the syndrome accumulator and the comparator, to store the first and second pluralities of the syndrome bits.

34. The device of claim 31, wherein the error correction circuit further comprises a syndrome buffer, coupled between the syndrome latch and the multiplexer, to transfer the first and second pluralities of the syndrome bits to the multiplexer.

35. The device of claim 25, wherein the syndrome accumulator is further coupled to receive the second pre-read data byte.

36. The device of claim 25, wherein the data word byte counter is capable of generating a plurality of odd bits and a plurality of even bits of a byte count, and wherein the error correction circuit further comprises:
(viii) a first channel coupled between the data word byte counter and the syndrome accumulator to transfer the even bits from the data word byte counter to the syndrome accumulator; and
(ix) a second channel coupled between the data word byte counter and the syndrome accumulator to transfer the odd bits from the data word byte counter to the syndrome accumulator.

37. The device of claim 36, wherein the first channel is capable of transferring five bits and the second channel is capable of transferring four bits.

38. The device of claim 36, wherein the data word byte counter is capable of counting the data bytes of each of the data words to generate a binary count within a plurality of counter bits, at least two of the counter bits having a binary 1.

39. The circuit of claim 36 for error correction of a page of memory comprising a plurality of words, the circuit further comprising a third channel coupled between the data word byte counter and the syndrome accumulator to initiate syndrome accumulation by the syndrome accumulator during data reading operation.

40. The circuit of claim 39, wherein the page of memory comprises a first group of 10 words, each word within the first group comprising 20 bytes.

41. The circuit of claim 40, wherein the page of memory further comprises a second group of words subsequent to the first group of words in sequence, each word within the second group comprising 24 bytes.

42. The circuit of claim 41, wherein the page of memory further comprises a final word subsequent to the second group of words in sequence, the final word comprising 16 bytes.

43. The device of claim 42, wherein the data word byte counter is capable of counting the data bytes of each of the data words to generate a binary count within five bits, at least two of the five bits having a binary 1.

44. The device of claim 25, wherein the first and second pre-read data bytes each comprise 8 bits.

45. The device of claim 44, wherein the first plurality of syndrome bits comprise a plurality of byte error address bits and the second plurality of syndrome bits comprise a plurality of bit error address bits, the byte error address bits being higher order bits and the bit error address bits being lower order bits of the syndrome.

46. The device of claim 45, wherein the byte error address bits comprise five bits and the bit error address bits comprise 3 bits.

47. The device of claim 46, wherein the data word byte address bits generated by the data word byte address generator comprise five bits.

48. The device of claim 25, wherein the first data encoder comprises a first block encoder capable of generating a first plurality of coded bits and a first parity bit associated with the first plurality of coded bits, and the second data encoder comprises a second block encoder capable of generating a second plurality of coded bits and a second parity bit associated with the second plurality of coded bits.

49. The device of claim 48, wherein the first and second block encoders comprise first and second Hamming encoders, respectively.

50. The device of claim 48, wherein the first and second pluralities of the coded bits each comprise 3 bits.

51. The device of claim 25, wherein the error correction circuit further comprises a first channel coupled between the data word byte address generator and the syndrome accumulator to transfer the data word byte address bits to the syndrome accumulator, the data word byte address bits comprising a plurality of write byte address bits in a write operation.

52. The device of claim 51, wherein the error correction circuit further comprises a second channel coupled between the data word byte address generator and the syndrome accumulator to initiate syndrome accumulation by the syndrome accumulator during data writing operation.

53. The device of claim 51, wherein the write byte address bits comprise five bits.

54. An error correction circuit for a memory device, comprising:
(a) a data word byte counter;
(b) first and second data encoders capable of receiving first and second pre-read data bytes, respectively;
(c) a multiplexer coupled to the second data encoder;
(d) a syndrome accumulator, coupled to the data word byte counter and the first and second data encoders, capable of generating a syndrome comprising first and second pluralities of syndrome bits;
(e) a syndrome latch, coupled between the syndrome accumulator and the multiplexer, to store the first and second pluralities of the syndrome bits;
(f) a data word byte address generator, coupled to the syndrome accumulator, capable of generating a plurality of data word byte address bits;
(g) a comparator, coupled to the syndrome latch and the data word byte address generator, capable of generating an error correction enable signal in response to comparing the first plurality of the syndrome bits with the data word byte address bits;
(h) a decoder, coupled to the syndrome latch, capable of decoding the second plurality of the syndrome bits to generate a plurality of decoded data input bits; and
(i) a correction enable buffer, coupled to the comparator and the decoder, capable of generating a plurality of correction bits in response to receiving the decoded data input bits and the error correction enable signal.

55. The circuit of claim 54, further comprising a buffer, coupled between the syndrome latch and the multiplexer, to transfer the first and second pluralities of the syndrome bits to the multiplexer.

56. The circuit of claim 54, wherein the syndrome accumulator is further coupled to receive the second pre-read data byte.

57. The circuit of claim 54, wherein the data word byte counter is capable of generating a plurality of odd bits and a plurality of even bits of a byte count, further comprising:
(j) a first channel coupled between the data word byte counter and the syndrome accumulator to transfer the even bits from the data word byte counter to the syndrome accumulator; and
(k) a second channel coupled between the data word byte counter and the syndrome accumulator to transfer the odd bits from the data word byte counter to the syndrome accumulator.

58. The circuit of claim 57, wherein the first channel is capable of transferring five bits and the second channel is capable of transferring four bits.

59. The circuit of claim 57, wherein the data word byte counter is capable of counting the data bytes of each of the data words to generate a binary count within a plurality of counter bits, at least two of the counter bits having a binary 1.

60. The circuit of claim 57 for error correction of a page of memory comprising a plurality of words, the circuit further comprising a third channel coupled between the data word byte counter and the syndrome accumulator to initiate syndrome accumulation by the syndrome accumulator during data reading operation.

61. The circuit of claim 60, wherein the page of memory comprises a first group of 10 words, each word within the first group comprising 20 bytes.

62. The circuit of claim 61, wherein the page of memory further comprises a second group of words subsequent to the first group of words in sequence, each word within the second group comprising 24 bytes.

63. The circuit of claim 62, wherein the page of memory further comprises a final word subsequent to the second group of words in sequence, the final word comprising 16 bytes.

64. The circuit of claim 54, wherein the first and second pre-read data bytes each comprise 8 bits.

65. The circuit of claim 64, wherein the first plurality of syndrome bits comprise a plurality of byte error address bits and the second plurality of syndrome bits comprise a plurality of bit error address bits, the byte error address bits being higher order bits and the bit error address bits being lower order bits of the syndrome.

66. The circuit of claim 65, wherein the byte error address bits comprise five bits and the bit error address bits comprise 3 bits.

67. The circuit of claim 66, wherein the data word byte address bits generated by the data word byte address generator comprise five bits.

68. The circuit of claim 54, wherein the first data encoder comprises a first block encoder capable of generating a first plurality of coded bits and a first parity bit associated with the first plurality of coded bits, and the second data encoder comprises a second block encoder capable of generating a second plurality of coded bits and a second parity bit associated with the second plurality of coded bits.

69. The circuit of claim 68, wherein the first and second block encoders comprise first and second Hamming encoders, respectively.

70. The circuit of claim 68, wherein the first and second pluralities of the coded bits each comprise 3 bits.

71. The circuit of claim 54, further comprising a first channel coupled between the data word byte address generator and the syndrome accumulator to transfer the data word byte address bits to the syndrome accumulator, the data word byte address bits comprising a plurality of write byte address bits during data writing operation.

72. The circuit of claim 71, further comprising a second channel coupled between the data word byte address generator and the syndrome accumulator to initiate syndrome accumulation by the syndrome accumulator during data writing operation.

73. The circuit of claim 71, wherein the write byte address bits comprise five bits.

74. A memory device, comprising:
(a) a memory array;
(b) an error correction circuit, coupled to the memory array, comprising:
  (i) a data word byte counter;
  (ii) first and second data encoders capable of receiving first and second pre-read data bytes, respectively;
  (iii) a multiplexer coupled to the second data encoder;
  (iv) a syndrome accumulator, coupled to the data word byte counter and the first and second data encoders, capable of generating a syndrome comprising first and second pluralities of syndrome bits;
  (v) a syndrome latch, coupled between the syndrome accumulator and the multiplexer, to store the first and second pluralities of the syndrome bits;
  (vi) a data word byte address generator, coupled to the syndrome generator, capable of generating a plurality of data word byte address bits;
  (vii) a comparator, coupled to the syndrome latch and the data word byte address generator, capable of generating an error correction enable signal in response to comparing the first plurality of the syndrome bits with the data word byte address bits;
  (viii) a decoder, coupled to the syndrome latch, capable of decoding the second plurality of the syndrome bits to generate a plurality of decoded data input bits; and
  (ix) a correction enable buffer, coupled to the comparator and the decoder, capable of generating a plurality of correction bits in response to receiving the decoded data input bits and the error correction enable signal; and
(c) an input-output multiplexer buffer coupled to the memory array and to the correction enable buffer.

75. The device of claim 74, wherein the error correction circuit further comprises a buffer, coupled between the syndrome latch and the multiplexer, to transfer the first and second pluralities of the syndrome bits to the multiplexer.

76. The device of claim 74, wherein the syndrome accumulator is further coupled to receive the second pre-read data byte.

77. The device of claim 74, wherein the data word byte counter is capable of generating a plurality of odd bits and a plurality of even bits of a byte count, wherein the error correction circuit further comprises:
  (x) a first channel coupled between the data word byte counter and the syndrome accumulator to transfer the even bits from the data word byte counter to the syndrome accumulator; and
  (xi) a second channel coupled between the data word byte counter and the syndrome accumulator to transfer the odd bits from the data word byte counter to the syndrome accumulator.

78. The device of claim 77, wherein the first channel is capable of transferring five bits and the second channel is capable of transferring four bits.

79. The device of claim 77, wherein the data word byte counter is capable of counting the data bytes of each of the data words to generate a binary count within a plurality of counter bits, at least two of the counter bits having a binary 1.

80. The circuit of claim 77 for error correction of a page of memory comprising a plurality of words, the circuit further comprising a third channel coupled between the data word byte counter and the syndrome accumulator to initiate syndrome accumulation by the syndrome accumulator during data reading operation.

81. The circuit of claim 80, wherein the page of memory comprises a first group of 10 words, each word within the first group comprising 20 bytes.

82. The circuit of claim 81, wherein the page of memory further comprises a second group of words subsequent to the first group of words in sequence, each word within the second group comprising 24 bytes.

83. The circuit of claim 82, wherein the page of memory further comprises a final word subsequent to the second group of words in sequence, the final word comprising 16 bytes.

84. The device of claim 83, wherein the data word byte counter is capable of counting the data bytes of each of the nineteen additional data words to generate a binary count within five bits, at least two of the five bits having a binary 1.

85. The device of claim 74, wherein the first and second pre-read data bytes each comprise 8 bits.

86. The device of claim 85, wherein the first plurality of syndrome bits comprise a plurality of byte error address bits and the second plurality of syndrome bits comprise a plurality of bit error address bits, the byte error address bits being higher order bits and the bit error address bits being lower order bits of the syndrome.

87. The device of claim 86, wherein the byte error address bits comprise five bits and the bit error address bits comprise 3 bits.

88. The device of claim 87, wherein the data word byte address bits generated by the data word byte address generator comprise five bits.

89. The device of claim 74, wherein the first data encoder comprises a first block encoder capable of generating a first plurality of coded bits and a first parity bit associated with the first plurality of coded bits, and the second data encoder comprises a second block encoder capable of generating a second plurality of coded bits and a second parity bit associated with the second plurality of coded bits.

90. The device of claim 89, wherein the first and second block encoders comprise first and second Hamming encoders, respectively.

91. The device of claim 89, wherein the first and second pluralities of the coded bits each comprise 3 bits.

92. The device of claim 74, wherein the error correction circuit further comprises a first channel coupled between the data word byte address generator and the syndrome accumulator to transfer the data word byte address bits to the syndrome accumulator, the data word byte address bits comprising a plurality of write byte address bits during data writing operation.

93. The device of claim 92, wherein the error correction circuit further comprises a second channel coupled between the data word byte address generator and the syndrome accumulator, to initiate syndrome accumulation by the syndrome accumulator during data writing operation.

94. The device of claim 92, wherein the write byte address bits comprise five bits.

95. The device of claim 74, wherein the input-output multiplexer buffer is capable of inverting the correction bits received from the correction enable buffer.

96. The device of claim 74, further comprising a pre-read input-output bus coupled between the error correction circuit and the memory array.

97. The device of claim 74, further comprising a data input buffer coupled to the input-output multiplexer buffer.

98. The device of claim 97, further comprising a data output buffer coupled to the input-output multiplexer buffer.

99. The device of claim 98, further comprising a data bus coupled to the data input and output buffers.

* * * * *